United States Patent
Pasotti et al.

(10) Patent No.: US 9,442,149 B2
(45) Date of Patent: Sep. 13, 2016

(54) MEASURING LEAKAGE CURRENTS AND MEASURING CIRCUIT FOR CARRYING OUT SUCH MEASURING

(71) Applicant: STMicroelectronics S.r.l., Agrate Brianza (IT)

(72) Inventors: Marco Pasotti, Travaco' Siccomario (IT); Fabio De Santis, Milan (IT)

(73) Assignee: STMicroelectronics S.r.l., Agrate Brianza (MB) (IT)

( * ) Notice: Subject to any disclaimer, the term of this patent is extended or adjusted under 35 U.S.C. 154(b) by 118 days.

(21) Appl. No.: 14/326,263

(22) Filed: Jul. 8, 2014

(65) Prior Publication Data
US 2015/0008939 A1    Jan. 8, 2015

(30) Foreign Application Priority Data

Jul. 8, 2013 (IT) .............................. MI2013A1144

(51) Int. Cl.
  *H01H 31/12* (2006.01)
  *G01R 31/02* (2006.01)
  *G01R 19/165* (2006.01)

(52) U.S. Cl.
  CPC ....... *G01R 31/025* (2013.01); *G01R 19/16571* (2013.01)

(58) Field of Classification Search
  CPC .......... G01R 31/025; G01R 19/16571; G01R 31/02; G01R 31/024; G01R 31/28; G01R 31/30; G01R 31/3004; G01R 31/3008; G01R 19/145; G01R 19/15
  USPC .............. 324/551, 511, 750.3; 340/654, 644, 340/636, 650, 651, 660, 664; 361/23, 31, 361/20, 18, 30, 191; 73/117.2, 129; 323/285, 299, 300, 301
  See application file for complete search history.

(56) References Cited

U.S. PATENT DOCUMENTS 5,838,524 A * 11/1998 Phillips .................. G05F 3/247
                                                        361/18
6,201,479 B1    3/2001 Zydek et al.
(Continued)

FOREIGN PATENT DOCUMENTS

JP         2000275300         10/2000

OTHER PUBLICATIONS

Search Report for Italian patent application No. MI20131144; Munich, Germany, Mar. 19, 2014; 2 pages.

*Primary Examiner* — Arleen M Vazquez
*Assistant Examiner* — Steven Yeninas
(74) *Attorney, Agent, or Firm* — Gardere Wynne Sewell LLP

(57) ABSTRACT

An embodiment of a measuring circuit for measuring the leakage current flowing in a portion of an electronic device when said portion is biased by a biasing unit of the electronic device is proposed. The measuring circuit includes a first section configured to generate a threshold current, a second section configured to receive the leakage current, a third section configured to compare the threshold current with the leakage current, and a fourth section configured to generate an output voltage based on the comparison between the threshold current and the leakage current. Said first section is configured to set the value of said threshold current to a different value at each reiteration of an operating cycle. Said fourth section is configured to measure said leakage current based on a detection of a change in the value of the output voltage between two reiterations of the operating cycle.

19 Claims, 2 Drawing Sheets

(56) References Cited

U.S. PATENT DOCUMENTS

2006/0248416 A1  11/2006  Furukawa

2010/0257492 A1* 10/2010  Joshi .................... G01R 31/025
                                                716/100

* cited by examiner

US 9,442,149 B2

1

MEASURING LEAKAGE CURRENTS AND MEASURING CIRCUIT FOR CARRYING OUT SUCH MEASURING

PRIORITY CLAIM

The instant application claims priority to Italian Patent Application No. MI2013A001144, filed 8 Jul. 2013, which application is incorporated herein by reference in its entirety.

TECHNICAL FIELD

One or more embodiments relate to the field of electronics. More specifically, an embodiment relates to a method and a circuit for measuring the leakage currents that are generated in the integrated electronic devices.

SUMMARY

In electronic devices integrated in semiconductor chips, henceforth simply referred to as "electronic devices", with the generic term "leakage current" it is intended a set of phenomena that leads to the generation of unwanted currents that disadvantageously increase power consumption. Examples of leakage currents which afflict electronic devices include: the unwanted current that may flow through reverse-biased pn junctions, the unwanted current that may flow across the source and drain nodes of a MOS (Metal Oxide Semiconductor) transistor, and the unwanted current that may flow through layers of insulating material (such as the insulating layer of the gate of a MOS transistor).

The leakage-current values depend on both the operating parameters of the electronic device, such as the values of the voltages to which it is subjected during operation and its operating temperature, and the parameters of the manufacturing process of the device itself. Making, for example, reference to the leakage current that originates by reverse biasing a pn junction, the value of this current increases as the temperature increases and as the bias voltage applied to the junction increases (in absolute value). If the applied bias voltage exceeds (in absolute value) a maximum value, called in jargon "breaking value", the leakage current experiences an abrupt increasing.

During the design of an electronic device, one may estimate in advance the leakage current through circuit simulators, taking into account the parameters of the process with which the device is to be implemented. However, given the large number of considered variables, even using circuit simulators, in some cases the values of the leakage current cannot be easily deduced. Consequently, one technique is to size the device with safety margins, decreasing the nominal efficiency obtainable to reduce the real leakage current.

For example, in certain applications, such as in non-volatile memory devices, some junctions—such as the junctions between the n-type wells and the p-type substrate—are reverse biased with high voltages (in value absolute) that are close to the breaking value, in order to increase the efficiency of programming and erasing. However, because of the tolerances of the manufacturing process, the breaking value may vary from device to device. Consequently, once a simulation of leakage currents has been carried out, typically the memory device is designed so as to reverse bias the junctions with voltages that are sufficiently lower (in absolute value) than the nominal breaking value, thus reducing the increase of programming and erasing efficiency. This disadvantage is exacerbated by the fact that the condition of

2 a reverse-biased junction with a voltage close to the breaking value typically is not a good working point for circuit simulators.

In general terms, one or more embodiments provide making a measurement of the leakage currents directly on the formed device, in actual biasing conditions, by means of a suitable measuring circuit.

An embodiment includes a measuring circuit for measuring the leakage current flowing in a portion of an electronic device when said portion is biased by a biasing unit of the electronic device. Said measuring circuit includes a first section configured to generate a threshold current, a second section configured to receive the leakage current, a third section configured to compare the threshold current with the leakage current, and a fourth section configured to generate an output voltage based on the comparison between the threshold current and the leakage current. Said third section is configured to set the value of said threshold current to a different value at each reiteration of an operating cycle. Said fourth section is configured to measure said leakage current based on a detection of a change in the value of the output voltage between two reiterations of the operating cycle.

A further embodiment relates to a semiconductor chip including the measuring circuit.

A still further embodiment relates to a corresponding method of measuring the leakage current.

BRIEF DESCRIPTION OF THE DRAWINGS

One or more embodiments, as well as additional features and advantages, will be best understood by reference to the following detailed description, given purely by way of non-limiting example, to be read in conjunction with the attached figures.

DETAILED DESCRIPTION

Figure 1:
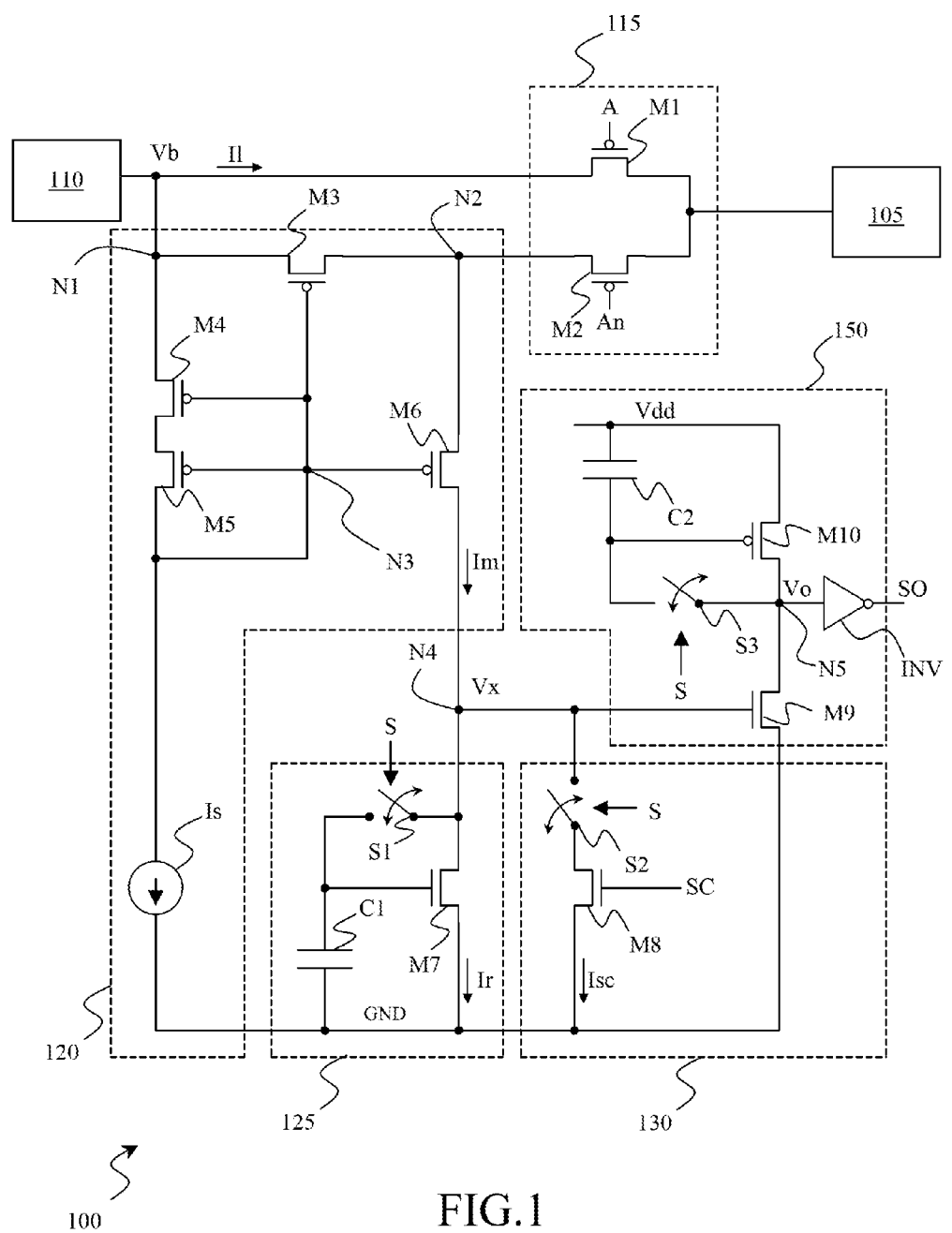
FIG. 1 is a scheme of a measuring circuit in accordance with an embodiment.

Referring in particular to the drawings, FIG. 1 is a diagram of a measuring circuit 100 in accordance with an embodiment for measuring the leakage current flowing in a portion 105 of an electronic device (not shown) when this portion 105 is biased by a biasing unit 110 for the electronic device. The measuring circuit 100 and the electronic device including the portion 105 and the biasing unit 110 may, for example, be integrated in a same semiconductor chip, such as a silicon chip.

The electronic device may be a memory device, for example, a non-volatile memory device such as a flash memory, with the portion 105 that may be the junction between an n-type well and the p-type substrate of the electronic device, or the junction between the drain active area of an n-channel MOS transistor and the p-type well in which the transistor is realized in the electronic device, and the biasing unit 110 which may be a booster circuit for the electronic device—such as for example a charge pump—adapted to reverse bias this junction.

The measuring circuit 100 includes five main sections 115, 120, 125, 130, 150.

The section 115 includes a first p-channel MOS transistor M1 and a second p-channel MOS transistor M2. The transistor M1 has a control node for receiving a control digital signal A (adapted to assume a high logic value and a low logic value), a first conduction node coupled to the biasing unit 110 for receiving a bias voltage Vb, and a second conduction node coupled to the portion 105 of the electronic device 105 to provide the bias voltage Vb when the control digital signal A is at the low logic value. The transistor M2 has a control node adapted to receive a control digital signal An corresponding to the logical negation (the complement) of the control digital signal A, a first conduction node coupled to the biasing unit 110 through the section 120 to receive the bias voltage Vb, and a second conduction node coupled to the portion 105 of the electronic device to provide the bias voltage Vb when the control digital signal An is at the low logic value.

The section 120 includes a p-channel MOS transistor M3 having a first conduction node coupled to the first conduction node of the transistor M1 (defining a circuit node N1), a second conduction node coupled to the first conduction node of the transistor M2 (defining a circuit node N2), and a control node coupled to the control nodes of three additional p-channel MOS transistors M4, M5, M6 (defining a circuit node N3). The transistor M4 also has a first conduction node coupled to the node N1 and a second conduction node coupled to a first conduction node of the transistor M5. The transistor M6 also has a first conduction node coupled to the node N2 and a second conduction node coupled to the sections 125, 130 and 150 (defining a circuit node N4). The transistor M5 is coupled in a diode configuration, with a second conduction node coupled to its control node (and thus to the node N3). The section 120 further includes a constant current generator Is having a first node coupled to the node N3 and a second node coupled to a reference node, here a reference node GND for receiving the ground voltage.

The section 125 includes an n-channel MOS transistor M7 having a first conduction node coupled to the node N4, a second conduction node coupled to the reference node GND, and a control node coupled to a first node of a first storage capacitor C1. The first storage capacitor C1 has a second node coupled to the reference node GND. The section 125 further includes an electronic switch S1 having a first conduction node coupled to the control node of the transistor M7 and a second conduction node coupled to the node N4. The electronic switch S1 is controlled by a control digital signal S (adapted to assume a high logic value and a low logic value), which determines the opening-closing state thereof. For example, if the control digital signal S is at the low logic value, the electronic switch S1 is open, and the switch's first conduction node and the second conduction node are electrically isolated from one another, while if the control digital signal S is at the high logic value, the switch S1 closes, electrically coupling the switch's first conduction node to the switch's second conduction node.

The section 130 includes an n-channel MOS transistor M8 having a first conduction node coupled to the reference node GND, a second conduction node coupled to a first conduction node of an electronic switch S2, and a control node adapted to receive a comparison analog signal SC (which signal is adapted to assume any value between the ground voltage and the supply voltage, as will be described in detail in a following portion of this description). The electronic switch S2 has a second conduction node coupled to the node N4. The electronic switch S2 is controlled by the control digital signal S, which determines the opening-closing state thereof in the same way as for the electronic switch S1.

The section 150 includes a comparator circuit including an n-channel MOS transistor M9, a p-channel MOS transistor M10, a capacitor C2 and an electronic switch S3. The transistor M9 has a first conduction node coupled to the reference node GND, a second conduction node coupled to a first conduction node of the transistor M10 (defining a circuit node N5), and a control node coupled to the node N4. The transistor M10 has a second control node coupled to a power supply node Vdd to receive a supply voltage, and a control node coupled to a first node of the capacitor C2. The capacitor C2 has a second node coupled to the supply node Vdd. The electronic switch S3 has a first conduction node coupled to the control node of the transistor M10, and a second conduction node coupled to the node N5. The electronic switch S3 is controlled by the control digital signal S, which determines the opening-closing state thereof in the same way as for the electronic switch S1 and the electronic switch S2. The section 150 further includes a logic inverter INV having an input node coupled to the node N5 and an output node for providing a detection digital signal SO.

Figure 2:
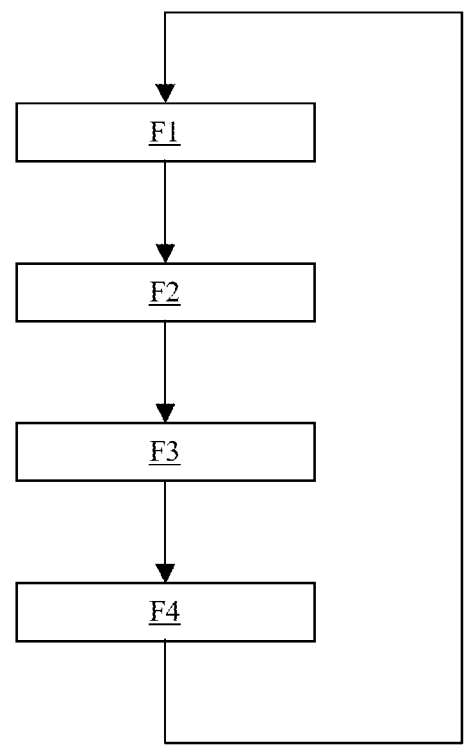
FIG. 2 is a functional block diagram illustrating the phases of the operation of the measuring circuit of FIG. 1 in accordance with an embodiment.

As schematically illustrated in FIG. 2, the operation of the measuring circuit 100 in accordance with an embodiment provides for the repetition of an operating cycle including four distinct phases F1, F2, F3, F4. In the following description, the values taken by voltages of nodes or by currents of branches of the circuit 100 corresponding to a specific phase Fy (y=1, . . . , 4) will be indicated with the addition of the notation (y). In the case of variables with values independent of the specific phase, this notation will be absent.

In the first phase F1, called preliminary phase, the control digital signal A is set to the low logic level, the control digital signal An to the high logic level, and the control digital signal S to the low logic level.

In this configuration, the transistor M1 is on and the transistor M2 is off, and the portion 105 of the electronic device is biased with the bias voltage Vb generated by the biasing unit 110. The (possible) leakage current that is generated in the biasing of the portion 105 of the electronic device flows from the biasing unit 110 to this portion 105 through the transistor M1. In this phase, the electronic switches S1, S2, and S3 are all open.

In the second phase F2, referred to as sampling phase, the control digital signals A and An are kept to the logic levels of the first phase, while the control digital signal S is set to a high logic level.

Consequently, in this phase the leakage current continues to flow from the biasing unit 110 to the portion 105 of the electronic device through the transistor M1, while the electronic switches S1, S2 and S3 are all closed.

The current Is generated by the constant current generator Is is mirrored by the transistors M3-M6 from the section 120 to the node N4; consequently, because the transistors M3-M6 are sized accordingly, the current Im(2) flowing through the transistor M6 is substantially equal to Is.

The current Im(2) is subdivided at the node N4 into a current Isc(2) flowing in the transistor M8 (which in this phase is conductive, being that the electronic switch S2 is closed) and into a current Ir(2) flowing in the transistor M7.

Using the sign conventions adopted in figure, the current Ir(2) which flows through the transistor M7 is therefore a function of Im(2) and Isc(2), being equal to:

$$Ir(2)=Im(2)-Isc(2)=Is-Isc(2) \tag{1}$$

The intensity of the current Isc(2) is set by transistor M8 based on the comparison analog signal SC supplied to the control node of this transistor. Since the electronic switch S1 is closed, the control node of the transistor M7 turns out to be electrically coupled to the node N4, and the voltage Vx(2)

that develops on the node N4 due to the current Ir(2) which flows through the transistor M7 is stored across the capacitor C1.

A corresponding voltage Vo(2) develops on the node N5, which is a function of the voltage Vx(2) and of the ratio between the areas of the transistors M9 and M10. Given that the electronic switch S3 in this phase is closed, this voltage Vo is also stored across the capacitor C2.

In this phase, the voltage Vx(2) is a function of the current Ir(2)=Im(2)−Isc(2). The voltage Vx(2), therefore, depends on the comparison analog signal SC, but it does not depend on the leakage current Il, as the current Im(2) is equal to the current Is generated by the constant current generator Is, and the current Isc(2) is determined by the value of the comparison analog signal SC.

In the third phase F3, referred to as measuring phase, the control digital signal A is set to a high logic level, the control digital signal An to a low logic level, and the control digital signal S to the low logic level.

In this configuration, the transistor M1 is off and the transistor M2 is on. The leakage current Il that is generated from the biasing of the portion 105 of the electronic device flows from the biasing unit 110 to this portion 105 through the transistors M3 and M2. In this phase, the electronic switches S1, S2, and S3 are again all open.

Thanks to the presence of the capacitor C1, the control node of the transistor M7 is biased with a voltage value equal to the value of the voltage Vx(2) of the second phase, while the control node of the transistor M10 is biased with a voltage value equal to the value of the voltage Vo(2) of the second phase.

Unlike the previous phase F2, in which the current Im(2) that flowed through the transistor M6 was equal to the current Is generated by the constant current generator Is, in phase F3, the transistor M6 turns out to conduct a current Im(3) that also depends on the leakage current Il. In fact, thanks to the activation of the transistor M2, the transistors M3 and M6 are no longer coupled in series as in step F2, because the transistor M2 sinks from the node N2 a current equal to Il. This causes an imbalance of the two branches of the section 120 (i.e., the branch including the transistors M4 and M5, and the branch including the transistors M3 and M6), with the transistors M4 and M5 that are still conducting the current Is, the transistor M3 conducts a current equal to the sum of Is and Il, and the transistor M6 conducts a current Im(3) equal to:

$$Im(3)=Is-Il \quad (2)$$

Given that in this phase F3 the switch S2 is open, the current Isc(3) is null. Consequently, the current Ir(3), which passes through the transistor M7, is also dependent on the leakage current Il according to the following relationship:

$$Ir(3)=Im(3)=Is-Il \quad (3)$$

Comparing relationship (1) with the relationship (3), it is possible to define the following two states ST1, ST2:

$$ST1: Ir(3)>Ir(2) \rightarrow Il<Isc(2)$$

$$ST2: Ir(3)<Ir(2) \rightarrow Il>Isc(2).$$

Observing the variation of the current Ir flowing in the transistor M7 between the phase F2 and the phase F3, it is possible to determine whether the leakage current that flows from the biasing unit 110 to the portion 105 of the electronic device is lower (state ST1) or higher (state ST2) than the current Isc(2) flowing in the transistor M8 in step F2. In other words, the current Isc(2) is used as a comparison threshold for the leakage current Il. As will be described in the following, the current Isc(2) is set to a respective different value at each repetition of step F2.

Consequently, since the transistor M7 is biased (between the control node and the second conduction node) with the voltage that is stored across the capacitor C1 in the phase F2, the voltage Vx(3) of the node N4 (corresponding to the first conduction node of the transistor M7), will be subjected to a corresponding change:

$$ST1: Vx(3)>Vx(2) \rightarrow Il<Isc(2)$$

$$ST2: Vx(3)<Vx(2) \rightarrow Il>Isc(2)$$

In a manner similar to that observed for the current Ir, by observing the change of the voltage Vx of node N4 between the phase F2 and the phase F3, it is possible to determine whether the leakage current Il that flows from the biasing unit 110 to the portion 105 of the electronic device is lower (state ST1) or higher (state ST2) than the current Isc(2) flowing in the transistor M8 in phase F2.

The comparator circuit of the section 150 is configured to discern if the state defined by the current Isc(2) set in step F2 and by the current Il measured in phase F3 is the state ST1 or the state ST2. In phase F3, the comparator circuit of the section 150 acts as an inverter having the node N4 which serves as the input node, the node N5 serving as the output node, and a switching threshold depending on the voltage Vo(2)—stored across the capacitor C2 in the phase F2—which in turn depends on the voltage Vx(2), and thus on the current Isc(2). The transistors M9 and M10 are sized in such a way that:

in the state ST1, or with Vx(3)>Vx(2), the voltage Vo(3) assumes a value sufficiently low to ensure that the logic inverter INV brings the detection digital signal SO to the high logic value, and in the state ST2, or with Vx(3)<Vx(2), the voltage Vo(3) assumes a value sufficiently high to ensure that the logic inverter INV brings the detection digital signal SO to the low logic value.

Naturally, similar considerations also apply in case the relationship between the detection signal SO and the voltage Vo(3) is the opposite of the one just mentioned above.

In the fourth step F4, called reset phase, the circuit nodes of the circuit 100 and the capacitors C1, C2 are discharged, for example through a coupling to the ground node via appropriate discharge routes that can be selectively activated (not shown in the figure).

In accordance with an embodiment, the measurement of leakage current Il is carried out by repeating the operating cycle including the sequence of phases F1, F2, F3, F4, setting the voltage SC the first time the phase F2 is carried out to a value corresponding to a current Isc(2) that is greater than the maximum leakage current Il that is not desired, and decreasing this voltage at each subsequent repetition of the operating cycle—specifically, for each repetition of the phase F2—until it is observed a switching of the detection signal SO from the high logic value (indicative of the state ST1) to the low logic value (indicative of the state ST2). Given that in correspondence of the passage from the state ST1 (corresponding to the condition Il<Isc(2)) to the state ST2 (corresponding to the condition Il>Isc(2)) the leakage current Il exceeds the threshold Isc(2), once a switching of the detection signal SO is observed, it can be assumed that the actual value of the leakage current Il that flows from the biasing unit 110 to the portion 105 of the electronic device is between the value Isc(2) corresponding to the reiteration of the phase F2 in the operating cycle prior to the switching of the detection signal SO and the value Isc(2) corresponding to the reiteration of the phase F2 in the operating cycle in which the detection signal SO is switched.

Naturally, similar considerations apply in case the first time that the phase F2 is carried out, the voltage SC is set to a value corresponding to a current Isc(2) that is null, and increasing the voltage at each subsequent repetition of the phase F2, until a switching of the detection signal SO is observed from the low logic value (indicative of the state ST2) to the high logic value (indicative of the state ST1).

According to an embodiment, it is then possible to make a precise measurement of the leakage current directly on the completed device, in actual biasing conditions. The resolution of this measurement is related to the step change in Isc(2) from iteration to iteration, particularly the step change in Isc(2) between the iterations before and after the switching of the level of SO; the smaller this step change, the higher the resolution, and the larger this step change, the lower the resolution.

Furthermore, the circuit 100 of FIG. 1 and the device whose leakage current the circuit 100 measures may be disposed on an integrated circuit, which may be coupled to one or more other integrated circuits. One or more of these integrated circuits may be, or may include, a computing circuit such as a microprocessor or a microcontroller. And some or all of these integrated circuits may be disposed on a same integrated-circuit die, or some or all of these integrated circuits may be disposed on respective integrated-circuit dies.

Naturally, in order to satisfy local and specific requirements, a person skilled in the art may apply to an embodiment, such as the embodiment described above, many logical or physical modifications and alterations. More specifically, although one or more embodiments have been described with a certain degree of particularity, it should be understood that various omissions, substitutions and changes in the form and details as well as other embodiments are possible (such as with respect to numerical values). Particularly, different embodiments may even be practiced without the specific details set forth in the preceding description to provide a more thorough understanding thereof; conversely, well-known features may have been omitted or simplified in order not to obscure the description with unnecessary particulars. Moreover, it is expressly intended that specific elements or method steps described in connection with any embodiment of the disclosed solution may be incorporated in any other embodiment as a matter of general design choice.

From the foregoing it will be appreciated that, although specific embodiments have been described herein for purposes of illustration, various modifications may be made without deviating from the spirit and scope of the disclosure. Furthermore, where an alternative is disclosed for a particular embodiment, this alternative may also apply to other embodiments even if not specifically stated.

The invention claimed is:

1. A circuit, comprising:
    a current source circuit configured to generate a first source current in a first time period that is not affected by a leakage current sunk by a device and generate a second source current in a second time period that is affected by the leakage current;
    a threshold circuit configured to generate a threshold current;
    a reference circuit configured in the first time period to generate a first reference current in response to the threshold current and the first source current and configured in the second time period to generate a second reference current in response to the second source current but not the threshold current; and
    a comparator circuit configured to determine a relationship between the first and second reference currents that is indicative of a measurement of the leakage current sunk by the device.

2. The circuit of claim 1 wherein a value of the leakage current corresponds to a value of the threshold current set in response to an analog control signal.

3. The circuit of claim 1 wherein:
    the threshold circuit is configured to generate a value for the threshold current during an iteration of the first time period and to generate a subsequent value for the threshold current during a subsequent iteration of the first time period; and
    the comparator circuit is configured to determine a change in the relationship between the first and second reference currents from the iteration to the subsequent iteration, said measurement of the leakage current being indicated by said values of the threshold current.

4. The circuit of claim 1, wherein the current source circuit includes:
    a current generator configured to generate an input current; and
    a current mirror configured to generate the first source current in response to the input current.

5. The circuit of claim 1, wherein the current source circuit comprises:
    a current generator configured to generate a main current;
    a mirror circuit configured to generate the first source current in response to the main current; and
    a modifying circuit configured to modify operation of the mirror circuit to generate the second source current by applying the leakage current.

6. The circuit of claim 1, wherein the device comprises a junction between an n-type well and a p-type substrate of an electronic device.

7. The circuit of claim 1, wherein the device comprises a reverse biased p-n junction.

8. A method, comprising:
    generating a first source current in a first time period that is not affected by a leakage current sunk by a device;
    generating a second source current in a second time period that is affected by the leakage current;
    generating a threshold current;
    in the first time period, generating a first reference current in response to the threshold current and the first source current;
    in the second time period, generating a second reference current in response to the second source current but not the threshold current; and
    determining a relationship between the first and second reference currents that is indicative of a measurement of the leakage current.

9. The method of claim 8 wherein a value of the leakage current corresponds to a value of the threshold current.

10. The method of claim 8:
    wherein generating the threshold current includes generating a value of the threshold current during an iteration of the first time period and generating a subsequent value of the threshold current during a subsequent iteration of the first time period; and
    further comprising determining a value of the leakage current from the value of the threshold current during the iteration and the value of the threshold current during the subsequent iteration.

11. The method of claim 8:
  wherein generating the threshold current includes generating a value of the threshold current during an iteration of the first time period and generating a subsequent value of the threshold current during a subsequent iteration of the first time period; and
  further comprising determining a change in relationship between the first and second reference currents from the iteration to the subsequent iteration, said measurement of the leakage current being indicated by said values of the threshold current.

12. A measuring circuit for measuring a leakage current flowing in a portion of an electronic device, comprising:
  a first circuit configured to generate a threshold current;
  a second circuit configured to generate a measurement current that is selectively affected by the leakage current;
  a third circuit configured to generate a reference current in response to the threshold current and the measurement current when said measurement current is not affected by the leakage current;
  a comparison circuit configured to compare the measurement current, when said measurement current is affected by the leakage current, against the reference current and generate an output signal in response to the comparison that is indicative of a measurement of the leakage current;
  wherein the threshold current is set to a different value for each operating cycle iteration of the measuring circuit; and
  wherein the measurement of the leakage current is indicated by a detected change in logic state of the output signal between two successive operating cycle iterations.

13. The measuring circuit of claim 12, further comprising means for setting the different values of said threshold current during each operating cycle iteration.

14. The measuring circuit of claim 13, wherein said means for setting causes a decrease in the different values of said threshold current over successive operating cycle iterations.

15. The measuring circuit of claim 13, wherein said means for setting causes an increase in the different values of said threshold current over successive operating cycle iterations.

16. The measuring circuit of claim 12, further comprising a bypass circuit configured to bypass the leakage current around the second circuit in a sampling phase of each operating cycle iteration and further configured to apply the leakage current to the second circuit during a measurement phase of each operating cycle iteration.

17. The measuring circuit of claim 16, wherein the first circuit is connected to the third circuit during the sampling phase and disconnected from the third circuit during the measurement phase.

18. A measuring circuit for measuring a leakage current flowing in a leakage portion of an electronic device, comprising:
  a current source transistor coupled between a first node and a second node and configured to generate a measurement current;
  a bypass circuit configured to selectively apply the leakage current to the first node in a measurement mode of operation only such that the measurement current is affected by the leakage current in the measurement mode of operation;
  a threshold current generator configured to selectively apply a threshold current to the second node during a sampling mode of operation;
  a reference current generator coupled between the second node and a reference node and configured to generate a reference current set by the measurement current and threshold current during the sampling mode but not affected by leakage current; and
  a comparison circuit configured to compare, in the measurement mode, the measurement current affected by the leakage current against the reference current and generate an output signal indicative of measurement of the leakage current.

19. The measuring circuit of claim 18, wherein the threshold current varies from iteration to iteration and measurement of the leakage current is indicated by values of the threshold current for successive iterations over which a logic value of the output signal changes state.

* * * * *